(12) United States Patent
Wong

(10) Patent No.: US 7,719,363 B2
(45) Date of Patent: May 18, 2010

(54) METHOD AND APPARATUS FOR OUTPUT AMPLIFIER PROTECTION

(75) Inventor: Lance Wong, San Francisco, CA (US)

(73) Assignee: Nuvoton Technology Corporation (TW)

( * ) Notice: Subject to any disclaimer, the term of this patent is extended or adjusted under 35 U.S.C. 154(b) by 14 days.

(21) Appl. No.: 12/185,060

(22) Filed: Aug. 1, 2008

(65) Prior Publication Data

US 2010/0026392 A1 Feb. 4, 2010

(51) Int. Cl.
*H03F 1/52* (2006.01)
(52) U.S. Cl. ............................. 330/298; 330/51
(58) Field of Classification Search ............... 330/298, 330/207 P, 156, 262, 207 A; 323/268, 274, 323/276
See application file for complete search history.

(56) References Cited

U.S. PATENT DOCUMENTS 5,945,877 A * 8/1999 Elango et al. ............... 330/156
7,167,055 B2 * 1/2007 Wong et al. ................ 330/298
2008/0030174 A1 * 2/2008 Niiyama ..................... 323/268
2009/0102561 A1 * 4/2009 Murin et al. ............... 330/262

* cited by examiner

*Primary Examiner*—Robert Pascal
*Assistant Examiner*—Hieu P Nguyen
(74) *Attorney, Agent, or Firm*—Townsed and Townsend and Crew LLP

(57) ABSTRACT

An amplifier circuit includes a first circuit and a second circuit connected in series. The first circuit has a first terminal coupled to a first power supply terminal, a second terminal coupled to an output node, and a control terminal for receiving a first signal for controlling a current flow. The second circuit has a first terminal coupled to the output node, a second terminal couple to a second power supply terminal, and a control terminal for receiving a second signal controlling a current flow in the first circuit. A bias circuit is coupled to the third terminal of the first circuit and is configured to limit a current flow in the first circuit when a voltage at the output node is outside a predetermined voltage range. In an embodiment, the bias circuit includes a plurality of diode devices connected in series and a switch device coupled to the diode devices.

20 Claims, 6 Drawing Sheets

METHOD AND APPARATUS FOR OUTPUT AMPLIFIER PROTECTION

BACKGROUND OF THE INVENTION

The present invention relates generally to CMOS integrated circuit techniques. More specifically, embodiments of the present invention provide methods and circuits for protecting power amplifier output circuit.

Amplifier circuits are ubiquitous in modern electronic devices. An electronic amplifier increases the power and/or amplitude of a signal. In many applications, power amplifier circuits are used at the output stage of a system to drive an external device. Merely as an example, in an audio system, an output power amplifier is often used to drive an external speaker.

Power amplifier circuits output stages can be classified as class A, B, AB, and C for analog signal amplification. This classification is based on the portion of the input signal cycle during which the amplifying device conducts.

A Class A amplifier operates over the whole of the input cycle such that the output signal is a magnified replica of the whole input with no clipping. Class A amplifiers are the usual means of implementing small-signal amplifiers. In a Class A circuit, the amplifying device operated over the linear portion of its characteristic curve. Because the device is always conducting, even if there is no input at all, power is drawn from the power supply. Accordingly, class A amplifiers tend to be relatively in efficient, especially for large power devices.

In contrast, Class B amplifiers only amplify half of the input signal cycle. As such they tend to create signal distortion, but their efficiency is greatly improved over Class A amplifiers. This is because the amplifying element is switched off and does not dissipate power half of the time. An application using Class B amplifiers is the complementary pair or "push-pull" arrangement. Here, complementary devices are used to each amplify the opposite halves of the input signal. The amplified two halves are then recombined at the output. This arrangement gives improved efficiency, but can suffer from the drawback of mismatch at the "joins" between the two halves of the signal, also known as the crossover distortion. An improvement can be achieved by biasing the devices such that neither of the two devices is completely off when they're not in use. This mode of circuit operation is called Class AB operation.

In Class AB operation, each device operates over half the wave similar to Class B operation, but each also conducts over a small signal range in the other half. As a result, when the waveforms from the two devices are combined, the crossover is reduced. Here the two active elements conduct more than half of the time as a means to reduce the cross-over distortions of Class B amplifiers.

In certain applications, it may be desirable to use Class C amplifiers, which conduct less than 50% of the input signal and the distortion at the output is high, but high efficiencies are possible. An application for Class C amplifiers is in RF transmitters.

An audio amplifier is an electronic amplifier that amplifies low-power audio signals to drive loudspeakers. Audio signals generally have frequencies between 20 hertz to 20,000 hertz, which is the human range of hearing. In a typical audio system, the audio amplifier is usually preceded by low power audio amplifiers which perform tasks like pre-amplification, equalization, tone control, mixing/effects, or audio sources like record players, CD players, and cassette players. Audio systems are used in public address systems, theatrical and concert sound reinforcement, and home sound systems, etc.

The sound card in a personal computer often contains several audio amplifiers, as does every stereo or home-theatre system. Audio amplifiers often need to meet stringent performance requirement. In some applications, the input signal to an audio amplifier may measure only a few hundred microwatts. However, its output power may be tens or hundreds of watts.

Because of these requirements, Class AB push-pull circuits are a popular design choice in audio power amplifiers. During much of the time the music is quiet enough that the signal stays in the Class A region, where it is amplified with good fidelity. For large signals, the crossover distortion is much smaller than in the Class AB region, as discussed above. For improved performance, the crossover distortion can be further reduced by using negative feedback techniques.

Even though audio amplifier circuits are widely used in many applications, certain limitations still exist. Some examples are discussed below. FIG. 1A is a simplified view diagram illustrating an output portion 100 of a conventional audio system. As shown in FIG. 1A, an audio frequency signal 102 entering an amplifier 104, which amplifies the signal and drives a speaker 108. A schematic diagram of 100 is shown in FIG. 1B, where the amplifier is shown as a preamplifier 105 and a CMOS output driver circuit 106 including a PMOS driver device and an NMOS driver device. The speaker 108 is shown as an equivalent 8 ohm resistance load.

In this specific example, the class AB amplifier is used for driving the speaker 108. During normal operation, the class AB amplifier delivers an large output current to the small ohmic speaker load, as shown in FIG. 2A. Under certain conditions, e.g., a short circuit at the output node, a large current can flow from the output driver through a wire to the ground, as depicted in FIG. 2B. In audio applications, during normal operation the gate of PMOS transistor P1 can have a voltage range from 0V to Vcc, e.g., 3.3 V. The 0V at the gate causes P1 to be in a hard turn-on condition. If the output node is shorted to ground, the current can be very large. This large current flow can cause damages to the audio system. For example, such large current can sometimes cause melting of bond wires.

Conventional output protection techniques are often ineffective or expensive. For example, extra current monitoring circuits can be used to sense how much current an output amplifier drives to a load. If the current exceeds a certain amount, the monitoring circuit turns the amplifier off. However, this approach has several drawbacks, including additional circuitry, more chip area, and power consumption. Alternatively, the voltage of the output node can be restricted to a safe range. However, this method can lead to degradation of system performance.

Accordingly, a simple and cost-effective method for protecting the output driver circuit is highly desirable.

BRIEF SUMMARY OF THE INVENTION

The present invention relates generally to electronic circuit techniques. More specifically, embodiments according to the present invention provide techniques for protecting an amplifier circuit against excess current conditions. In some embodiments, a protection circuit limits the magnitude of a current flow when a circuit node is outside a certain voltage range. In a specific example, the protection circuit is coupled to an output transistor of the amplifier, and includes a plurality of serially connected diode devices. When a voltage drop across the transistor exceeds a preset limit, the diode stack is activated to clamp the gate-to-source bias and restrict current flow in the transistor. Otherwise, the protection circuit does not interfere with normal operations of the system. Merely by way of example, the invention has been applied to an integrated circuit including an audio power amplifier for protecting against short circuit at an output driver circuit. But it would be recognized that the invention has a much broader range of applicability. For example, the invention can be applied to other types of amplifier circuits to limit the current flow at an internal circuit node in a desirable range.

According to an embodiment of the present invention, an amplifier circuit is provided. The amplifier circuit includes a PMOS transistor and an NMOS transistor. A source of the PMOS transistor is coupled to a voltage supply, e.g., at 3.3V. A drain of the PMOS transistor is coupled to an output node of the amplifier circuit. A drain of the NMOS transistor is coupled to the output node the amplifier circuit and the drain of the PMOS transistor. A source of the NMOS transistor is coupled to a ground potential, e.g., 0V. The amplifier circuit also includes a plurality of serially connected diode devices. In a specific example, the amplifier circuit has a first, a second, a third, a fourth, and a fifth diode devices. The first diode device is coupled to the power supply and the fifth diode device is coupled to the gate of the PMOS transistor. The amplifier circuit also includes a second PMOS transistor having a source connected between the first and the second diode devices, a drain connected between the third and the fourth diode devices, and a gate connected to the output node of the amplifier circuit. When the output node of the amplifier circuit is below a reference voltage, the second PMOS transistor is turned on and to clamp the gate-to-source bias of the first PMOS transistor within a predetermined voltage range.

In a specific embodiment of the amplifier circuit described above, the predetermined voltage range is substantially a sum of the voltage drops across the first, the fourth, and the fifth diode devices. In an embodiment, the reference voltage is approximately a sum of a voltage drop across the first diode device and a threshold voltage of the second PMOS transistor.

Depending on the embodiment, different rectifying devices can be used as the diode devices. For example, each of the diode devices can be a diode-connected PMOS transistors. Alternatively, each of the diode devices can be a pn junction diode. In a specific example, the amplifier circuit includes an output driver for a class AB power amplifier. In another embodiment the output node of the amplifier circuit is coupled to a speaker.

According to another embodiment of the invention, an amplifier circuit includes a first circuit having a first terminal coupled to a first power supply terminal, a second terminal coupled to an output node, and a control terminal for receiving a first signal for controlling a current flow in the first circuit. The amplifier circuit also includes a second circuit, having a first terminal coupled to the output node, a second terminal couple to a second power supply terminal, and a control terminal for receiving a second signal controlling a current flow in the first circuit. Additionally, the amplifier circuit includes a bias circuit coupled to the third terminal of the first circuit, and is configured to limit a current flow in the first circuit when a voltage at the output node is outside a predetermined voltage range.

In a specific embodiment of the amplifier circuit described above, the first power supply terminal is adapted for coupling to a power supply and the second power supply terminal is adapted for coupling to an electrical ground. In an alternative embodiment, the second power supply terminal is adapted for coupling to a power supply and the first power supply terminal is adapted for coupling to an electrical ground.

In an embodiment, the bias circuit includes a first terminal coupled to the first power supply terminal, a second terminal coupled to the control terminal of the first circuit, and a third terminal coupled to the output node of the amplifier circuit. The bias circuit also includes a plurality of diode devices connected in series between the first terminal and the second terminal, including a first internal node and a second internal node. The bias circuit further includes a switch device coupled between the first internal node and the second internal node. The switch device is configured to reduce a voltage drop between the first internal node and second internal node when the voltage of the output node of the amplifier circuit is out of the predetermined range.

In a specific embodiment of the bias circuit, the plurality of diode devices includes a first diode device between the first terminal and the first internal node, a second and a third diode devices between the first internal node and the second internal node, a fourth and a fifth diode devices connected between the second internal node and the second terminal.

In another embodiment, the number of diode devices in the bias circuit can be selected for different applications. In an example, the plurality of diode devices includes a first plurality of diode devices serially connected between the first terminal and the first internal node, a second plurality of diode devices serially connected between the first internal node and the second internal node, and a third plurality of diode devices serially connected between the second internal node and the second terminal. Depending on the application, various combinations of different diode devices can be included in each of the groups.

In an alternative embodiment, the bias circuit includes a first terminal coupled to the first power supply terminal, a second terminal coupled to control terminal of the first circuit, a third terminal coupled to the output node of the amplifier circuit. The bias circuit also includes a plurality of bias devices connected in series between the first terminal and the second terminal. A first bias device is connected between the first terminal and a first node, a second bias device is connected between the first internal node and a second internal node, and a third bias device is connected between the third internal node and the third terminal. In addition, the bias circuit includes a switch coupled between the first internal node and the second internal node. The switch is configured to reduce a voltage drop between the first internal node and second internal node when the voltage of the output node of the amplifier is out of the predetermined range.

According to yet another embodiment of the present invention, a bias circuit for providing a bias voltage to an electronic device. The electronic device has a control terminal for controlling a current flow between an input terminal and an output terminal of the electronic device. The bias includes a first terminal coupled to the input terminal of the electronic device, a second terminal coupled to the output terminal of the electronic device, and a third terminal coupled to the control terminal of the electronic device. The bias circuit also includes a plurality of bias devices connected in series between the first terminal and the second terminal. A first bias device is connected between the first terminal and a first internal node. A second bias device is connected between the first internal node and a second internal node, and a third bias device is connected between the second internal node and the second terminal. The bias circuit also has a switch coupled between the first internal node and the second internal node. A control terminal of the switch is coupled to the second terminal of the bias circuit. The switch is configured to reduce a voltage drop between the first internal node and second internal node when the voltage of the output terminal of the electronic device is out of a predetermined voltage range. In a specific embodiment, each of the bias devices comprises a rectifier device characterized by a turn-on voltage. In another embodiment, each of the bias devices comprises one or more diode devices.

According to an alternative embodiment, the present invention provides an audio system, which includes an input for receiving an audio frequency input signal and an amplifier circuit coupled to the input for receiving the audio frequency input signal. The amplifier circuit includes a first stage and a second stage connected in series between a power supply and a ground, the output driver having an output node and a control terminal for receiving a signal for controlling a current flow to the output node The output driver has an output node and a control terminal for receiving a signal for controlling a current flow to the output node. The audio system also includes a bias circuit coupled to the control terminal of the output driver. The bias circuit is configured to limit a current flow in the output driver when a voltage at the output node is outside a predetermined voltage range. Additionally, the audio system has a speaker connected to the output driver.

In a specific embodiment of the audio system, the bias circuit has a plurality of bias devices connected in series between a first terminal and a second terminal. A first bias device is connected between the first terminal and a first internal node. A second bias device is connected between the first internal node and a second internal node. A third bias device is connected between the second internal node and the second terminal. The bias circuit also includes a switch coupled between the first internal node and the second internal node. A control terminal of the switch is coupled to the second terminal of the bias circuit. The switch is configured to reduce a voltage drop between the first internal node and second internal node when the voltage of the output node of the output driver is out of a predetermined voltage range. In a specific embodiment, the switch is closed to connect the first and the second internal node, when the voltage of the output node of the output driver drops below a certain predetermined voltage, or is shorted to a ground or a power supply. In a specific embodiment, each of the bias devices comprises one or more diode devices. Of course, there can be other variations, modifications, and alternatives.

Many benefits are achieved by way of the present invention over conventional techniques. For example, an easy to use design is provided that is compatible with conventional integrated circuit design and fabrication process technologies. In certain embodiments, the invention provides techniques for protecting an amplifier circuit by adding a protection or bias circuit including a stack of diode devices to an output circuit stage. In a specific embodiment, the protection circuit can be activated to limit a current flow in the output circuit. When not activated, the protection circuit does not interfere with normal operations. In a specific embodiment, a simple protection circuit design includes a variable diode string, which consumes little or no power and costs minimal chip area. Merely as an example, an embodiment of the invention is applied to an output amplifier of an audio system. It is understood, however, the techniques provided herein can be easily adopted for other applications, such as in limiting a current or voltage in an internal circuit. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to electronic circuit techniques. More specifically, embodiments of the present invention provide techniques for protecting an amplifier circuit against short circuit conditions. Merely by way of example, the invention has been applied to an integrated circuit including an audio power amplifier for protecting against short circuit at an output driver circuit. But it would be recognized that the invention has a much broader range of applicability. For example, the invention can be applied to other types of amplifier circuits to limit the current flow in a desirable range.

Depending upon the embodiment, the present invention includes various features, which may be used. These features include the following:

1. Provide techniques for protecting an amplifier circuit using a protection circuit having a stack of diode devices in an output driver;
2. Provide a design of the protection circuit that is activated by a pre-selected condition to limit a current flow in the output circuit;
3. Provide a method for protection circuit that does not interfere with normal operations; and
4. Provide an easy to use design that that is compatible with conventional integrated circuit design and fabrication process technologies.

As shown, the above features may be in one or more of the embodiments to follow. These features are merely examples, which should not unduly limit the scope of the claims herein. One of ordinary skill in the art would recognize many variations, modifications, and alternatives.

Figure 3:
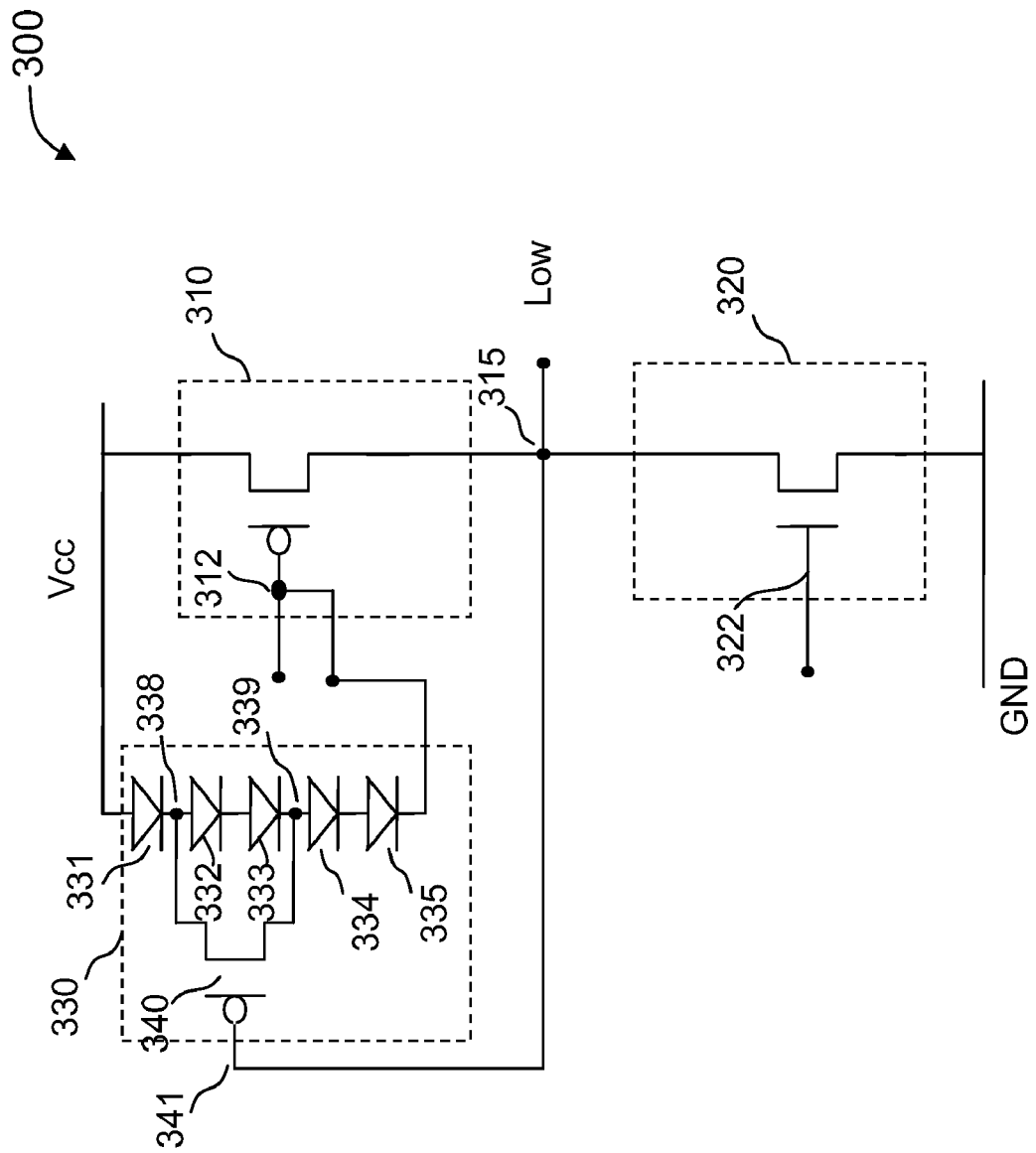
FIG. 3 is a simplified circuit diagram illustrating an output driver in an audio amplifier according to an embodiment of the present invention.

FIG. 3 is a simplified circuit diagram illustrating an output driver circuit 300 in an audio amplifier according to an embodiment of the present invention. This diagram is merely an example, which should not unduly limit the scope of the claims herein. As shown, output driver circuit 300 can be an output driver for an audio amplifier. In a specific application, the amplifier can be a class-AB audio amplifier.

Figure 1A:
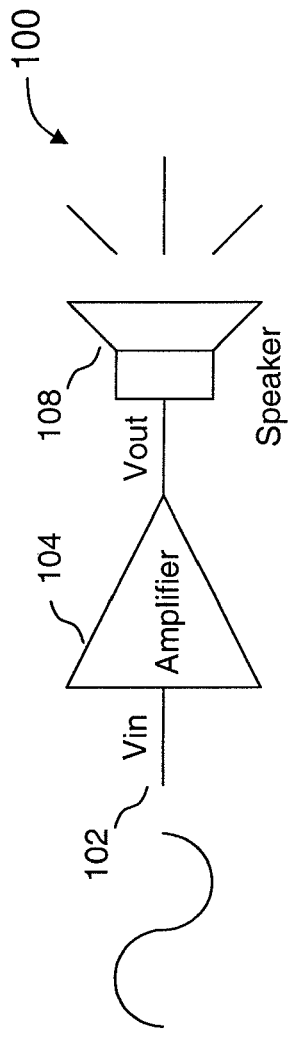
FIG. 1A is a simplified view diagram illustrating an output portion of a conventional audio system.
Figure 1B:
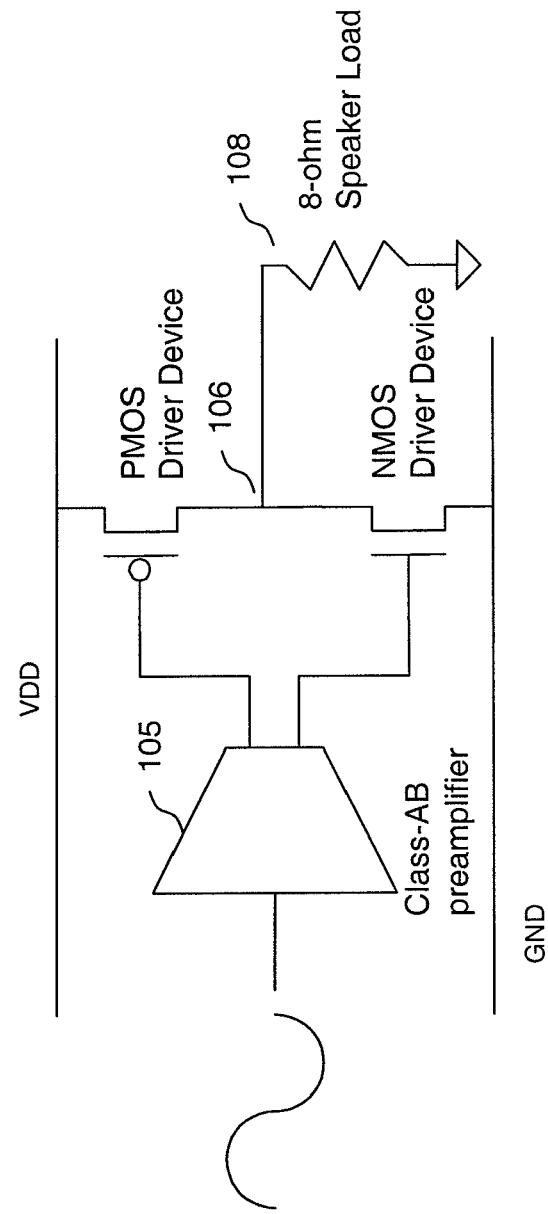
FIG. 1B is a simplified schematic diagram illustrating a conventional audio amplifier.
Figures 2A, 2B:
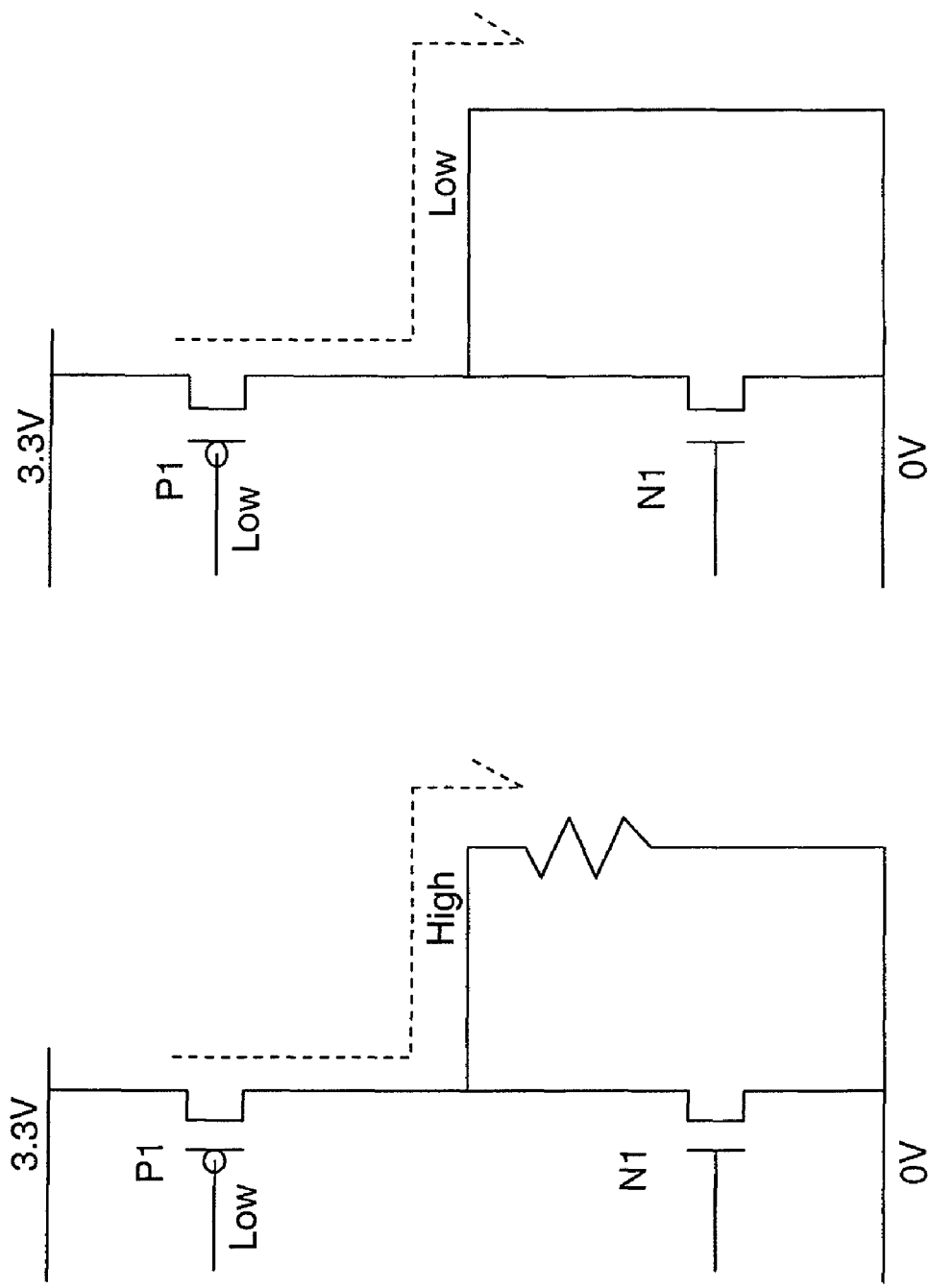
FIG. 2A is a simplified circuit diagram illustrating a current flow in an output driver of a conventional audio amplifier.
FIG. 2B is a simplified circuit diagram illustrating current flow in an output driver in a short-circuit condition in a conventional audio amplifier.

In FIG. 3, a CMOS output driver 300 is used as an example. However, one of ordinary skill in the art would recognize other variations, modifications, and alternatives. As shown, output driver circuit 300 includes a first PMOS transistor 310 and an NMOS transistor 320. A source of PMOS transistor 310 is coupled to a voltage supply Vcc. A drain of PMOS transistor 310 is coupled to an output node 315 of the amplifier circuit. A drain of NMOS transistor 320 is coupled to the output node 315 of the amplifier circuit and is also coupled to the drain of the first PMOS transistor 310. A source of NMOS transistor 320 is coupled to a ground GND. As an example, Vcc can be a 3.3 V power supply, and GND can be at 0V. Depending on the application, Vcc and GND can provide different voltages. Gate terminal 312 of PMOS transistor 310 and gate terminal 322 of NMOS transistor can be coupled to output terminals of a preamplifier, such as a class-AB preamplifier as shown in FIG. 1B.

As shown in FIG. 3, driver circuit 300 also includes a bias circuit 330. Bias circuit 330 has a plurality of serially connected diode devices. In a specific embodiment, these diode devices include five diode devices, namely, a first 331, a second 332, a third 333, a fourth 334, and a fifth 335 diode devices. The first diode device 331 is coupled to the power supply Vcc, and the fifth diode device 335 is coupled to gate 312 of PMOS transistor 310. Each of these diode devices provide a rectifying function, i.e., allowing current flow in one direction and blocking current flow in the other direction. Each diode device is also characterized by a turn-on voltage. As discussed below, each of these diode devices can be implemented using a p-n junction diode, a diode-connected NMOS transistor, a diode connected PMOS transistor, or a Schottky diode, etc.

Bias circuit 330 also includes a second PMOS transistor 340. In an embodiment, source terminal of PMOS transistor 340 is connected to node 338 between the first 331 and the second 332 diode devices. A drain terminal of PMOS transistor 340 is connected to a node 339 between the third 333 and the fourth 334 diode devices. Additionally, a gate terminal 341 of PMOS transistor 340 is connected to the output node 315 of the amplifier circuit. As discussed below, bias circuit 330 serves to limit a bias voltage at gate 312 of PMOS transistor 310 to prevent excessive current flow in the circuit.

In a specific embodiment of bias circuit 330 in FIG. 3, each diode device is a diode-connected PMOS transistor having a turn-on voltage $V_D$ of approximately 0.7 V. As a result, the diode stack of diode devices 331-315 does not conduct current unless the voltage drop across the stack of five diode devices is approximately 5 times $V_D$, or approximately 3.5 V, or higher. If, however, PMOS transistor is 340 turned on, then the voltage drop between nodes 338 and 339 is reduced. In other words, the effective turn-on voltage of the diode stack can be reduced if PMOS transistor 340 is turned on. Therefore during normal operation under a Vcc of 3.3 V, the diode stack is reverse biased and does not interfere with the operation of the circuit. On the other hand, since the gate of PMOS transistor 340 is connected to the output node 315, PMOS transistor 340 can be turned on when the output node 315 drops to a low voltage level. For example, if output node 315 is pulled to ground due to certain fault conditions, the voltage drop across the diode stack is approximately the sum of the turn-on voltages of diode devices 331, 334, and 335. That is, the diode stack serves to clamp the gate terminal 312 of PMOS transistor 310 to not lower than three diode turn-on voltages below Vcc. Assuming Vcc is 3.3 V and the turn-on voltages are approximately 0.7 V, then the gate terminal 312 of PMOS transistor 310 is prevented from reaching below 1.2 V (i.e. 3.3–3*07). Therefore, the gate-to-source voltage of PMOS transistor 310 is limited to not higher than approximately 2.1 V, or 3.3 V minus 1.2 V. As a result, excessive current flow is prevented through the output driver.

As discussed above, PMOS transistor 340 is configured to turn on when the output node 315 of the amplifier circuit is below a reference voltage. As a result, the effective turn-on voltage of the diode stack is reduced and to maintain a gate-to-source bias of PMOS transistor 310 within a predetermined voltage range. In the embodiment depicted in FIG. 3, the predetermined voltage range is substantially a sum of the voltage drops across the first, the fourth, and the fifth diode devices. In drive circuit 300 in FIG. 3, the reference voltage is approximately a sum of a voltage drop across the first diode device 331 and a threshold voltage of PMOS transistor 340. In another embodiment, the bias circuit is configured to maintain a current flow through PMOS transistor 310 within a predetermined current range, when the output node of the amplifier circuit is below a reference voltage. In this case, the allowable current range can be determined from the predetermined voltage range of the gate-to-source bias and other device parameters of PMOS transistor 310.

Although the above has been shown using a selected group of components for the output drive circuit for an amplifier, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

Figure 4C:
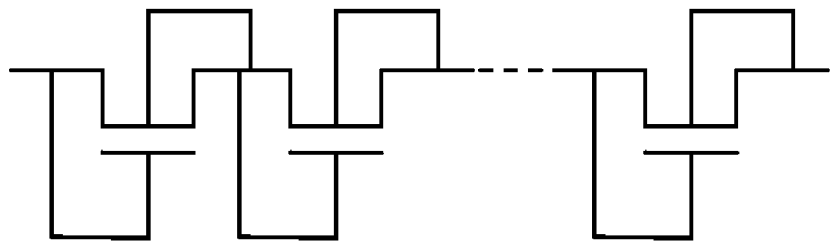
FIGS. 4A-4C are simplified circuit diagrams illustrating alternative components of a protection circuit for an output driver according to various embodiments of the present invention.
Figure 4B:
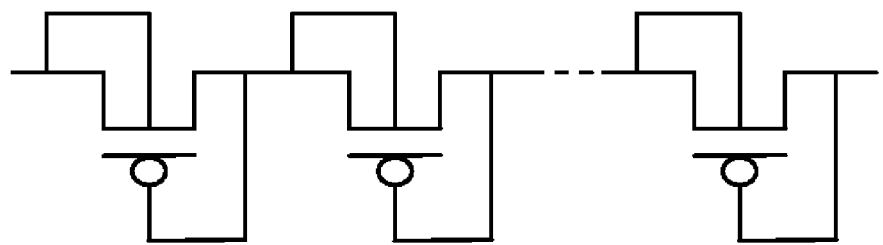
Figure 4A:

In FIG. 3, each of the diode devices in the diode stack is shown as a diode-connected PMOS transistor. However, there can be other variations and alternatives. FIGS. 4A-4C are simplified circuit diagrams illustrating alternative diode stack circuit for an output driver in an amplifier according to embodiments of the present invention. Depending on the embodiment, each of these diode devices can be implemented using a p-n junction diode (FIG. 4A), a diode-connected PMOS transistor (FIG. 4B), a diode connected NMOS transistor (FIG. 4C), or a Schottky diode (not shown), etc. Each type of diode device may have a different turn-on voltage, current range, and direction of rectified current flow. Each of these parameters can be selected depending on applications.

Figure 5:
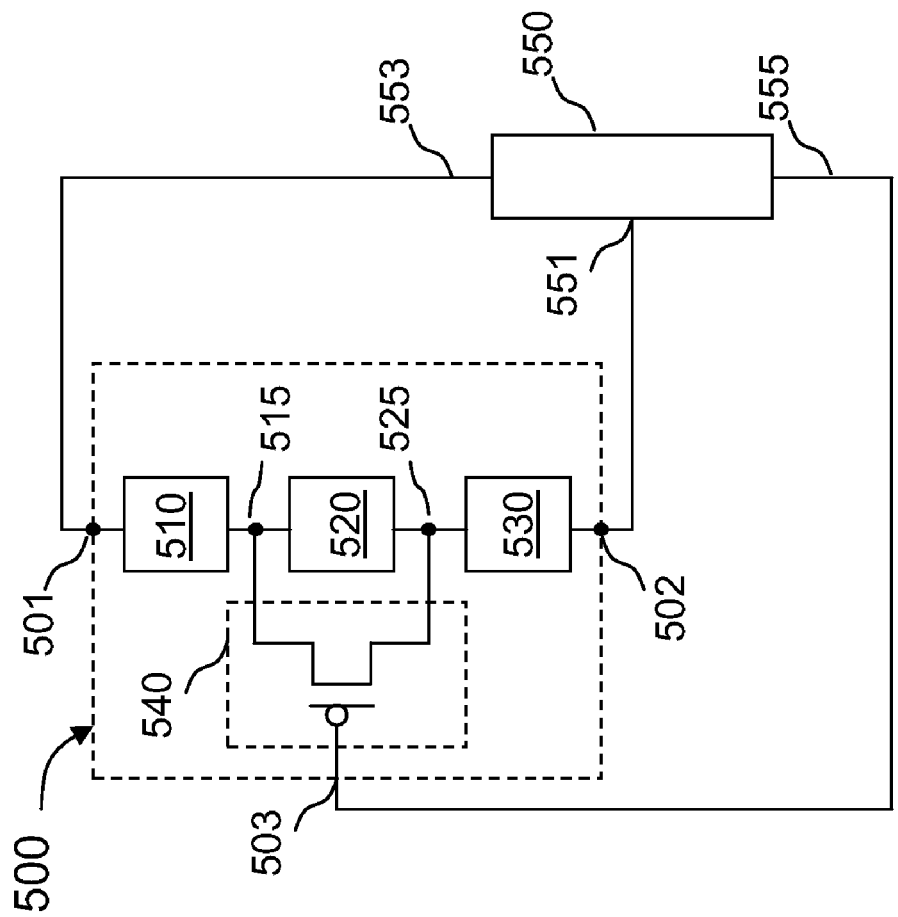
FIG. 5 is a simplified schematic diagram illustrating a bias circuit for an output driver circuit according to an alternative embodiment of the present invention.

Additional design flexibility can be obtained by allowing the bias circuit to include different kinds of rectifying devices instead of the diode stack having a plurality of identical diode devices. FIG. 5 is a simplified schematic diagram illustrating a bias circuit 500 for protecting an electronic device according to an alternative embodiment of the present invention. As shown, FIG. 5 illustrate a bias circuit 500 for providing a bias voltage to an electronic device 550. The electronic device 550 includes a control terminal 551 for controlling a current flow between an input terminal 553 and an output terminal 555 of the electronic device. Bias circuit 500 includes a first terminal 501 coupled to input terminal 553 of the electronic device 550 and a second terminal 502 coupled to the output terminal 555 of the electronic device. Bias circuit 500 also has a third terminal 503 coupled to the control terminal 551 of the electronic device. Depending on the application, the electronic device 500 can be an electronic circuit that supplies a current in response to a signal at a control terminal. For example, electronic device 500 can be an amplifier circuit as shown in FIG. 3.

Additionally, a plurality of bias devices are connected in series between the first terminal 501 and the second terminal 502. These bias devices include a first bias device 510 connected between the first terminal 501 and a first internal node 515. A second bias device 520 is connected between the first internal node 515 and a second internal node 525. Further, a third bias device 530 is connected between the second internal node 525 and the second terminal 502. As shown in FIG. 5, a switch device 540 is coupled between the first internal node 515 and the second internal node 525. A control terminal of switch 540 is coupled to the third terminal 503 of the bias circuit. According to embodiments of the invention, switch 540 is configured to reduce a voltage drop between the first internal node 515 and second internal node 525 when the voltage of the output terminal 555 of the electronic device 550 is out of a predetermined voltage range. In so doing, a bias voltage between the first and the second terminal of the bias circuit is reduced. Consequently, a bias voltage between the control terminal 551 and the input terminal 553 is also reduced. As a result, device 550 is protected against excessive current flow.

A specific embodiment of bias circuit 500 is depicted as bias circuit 330 in the amplifier in FIG. 3. In this particular embodiment, each of the bias devices include one or more diode device, in particular, diode-connected PMOS transistors. Of course, there can be modifications and alternatives. In an embodiment, each of the bias devices can include a rectifier device characterized by a certain turn-on voltage. In another embodiment, each of the bias devices can include one or more diode devices. As discussed above, the diode devices can be implemented using a p-n junction diode, a diode-connected NMOS transistor, a diode-connected PMOS transistor, or a Schottky diode, etc.

In FIG. 3, the bias circuit 330 is coupled to PMOS transistor 310 of the output driver, which is the device to be protected. However, one skilled in the art can recognize that a similar bias circuit can be form to bias the NMOS transistor and to limit the current flow in the NMOS transistor. The latter embodiment would be useful in, e.g., in preventing excessive current flow when the output node is shorted to the power supply. Furthermore, although a CMOS output driver circuit is shown in FIG. 3, the techniques presented here can use used with other types of output driver circuit.

Figure 6:
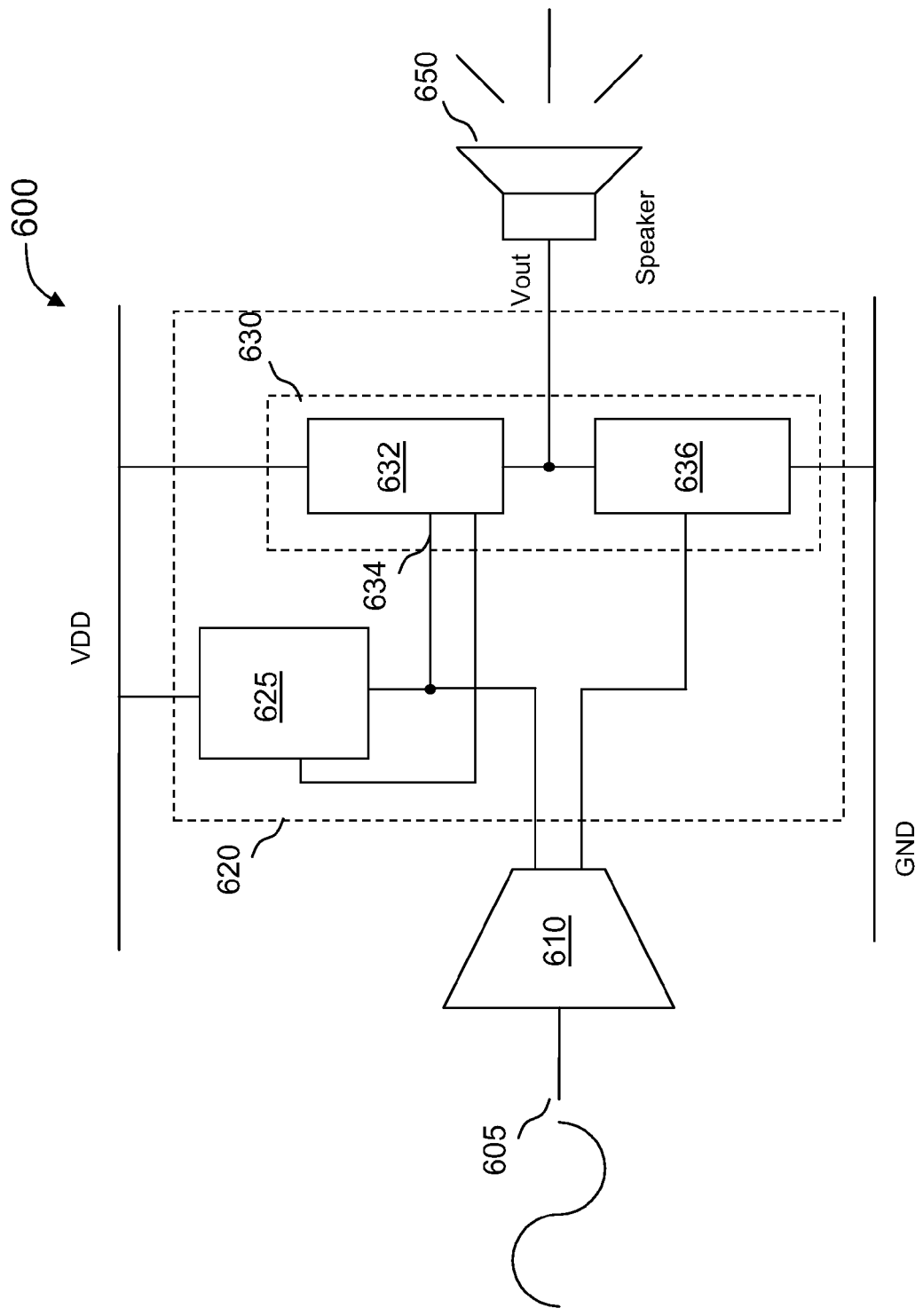
FIG. 6 is a simplified schematic diagram illustrating an audio system according to an embodiment of the present invention.

FIG. 6 is a simplified schematic diagram illustrating an audio system 600 according to an embodiment of the present invention. This diagram is merely an example, which should not unduly limit the scope of the claims herein. As shown, audio system 600 includes a preamplifier 610, an output amplifier 620, and a speaker 650. In an embodiment, preamplifier 610 can be a conventional class AB audio amplifier that receives audio frequency signal 605 and delivers amplified signals to the output amplifier 620.

In an embodiment, driver stage 620 includes output driver circuit 630 and bias circuit 625. In the specific example shown in FIG. 6, the output driver circuit 630 includes an upper stage 632 and a lower stage 636. A bias circuit may be coupled to either upper stage 632 and a lower stage 634. In a specific embodiment, output driver circuit 630 may include a CMOS output driver circuit as illustrated in FIG. 3.

In an embodiment, bias circuit 625 provides a bias voltage to a device in the output driver circuit 630, which can be either the upper stage 632 or lower stage 636. In the example shown in FIG. 6, the bias circuit 625 is coupled to the upper stage circuit 632, which has a control terminal 634 for controlling a current flow through the device. In a specific embodiment, bias circuit 625 may be similar to bias circuit 500 discussed above in connection with FIG. 5.

As shown in FIG. 5, the bias circuit includes a plurality of bias devices connected in series between a first terminal and a second terminal. A first bias device is connected between the first terminal and a first internal node, and a second bias device is connected between the first internal node and a second internal node. A third bias device is connected between the second internal node and the second terminal. The bias circuit also includes a switch coupled between the first internal node and the second internal node. A control terminal of the switch is coupled to the second terminal of the bias circuit. The switch is turned on to reduce a voltage drop between the first internal node and second internal node when the voltage of the output node of the output driver is out of a predetermined voltage range. In a specific embodiment, each of the bias devices includes a diode device.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. An amplifier circuit, comprising:
  a first PMOS transistor, a source of the PMOS transistor coupled to a voltage supply, a drain of the PMOS transistor coupled to an output node of the amplifier circuit;
  an NMOS transistor, a drain of the NMOS transistor coupled to the output node the amplifier circuit and the drain of the first PMOS transistor, a source of the NMOS transistor coupled to a ground potential;
  a plurality of serially connected diode devices including a first, a second, a third, a fourth, and a fifth diode devices, the first diode device being coupled to the power supply and the fifth diode device being coupled to the gate of the first PMOS transistor; and
  a second PMOS transistor having a source connected between the first and the second diode devices, a drain connected between the third and the fourth diode devices, and a gate connected to the output node of the amplifier circuit,
  whereby the second PMOS transistor is configured to turn on and to maintain a gate-to-source bias of the first PMOS transistor within a predetermined voltage range, when the output node of the amplifier circuit is below a reference voltage.

2. The amplifier circuit of claim 1 wherein the predetermined voltage range is substantially a sum of the voltage drops across the first, the fourth, and the fifth diode devices.

3. The amplifier circuit of claim 1 wherein the reference voltage is approximately a sum of a voltage drop across the first diode device and a threshold voltage of the second PMOS transistor.

4. The amplifier circuit of claim 1 wherein each of the diode devices is a diode-connected PMOS transistors.

5. The amplifier circuit of claim 1 wherein each of the diode devices is a pn junction diode.

6. The amplifier circuit of claim 1 wherein the amplifier circuit comprises an output driver for a class AB power amplifier.

7. The amplifier circuit of claim 1 wherein the output node of the amplifier circuit is coupled to a speaker.

8. An amplifier circuit, comprising:
  a first circuit, having a first terminal coupled to a first power supply terminal, a second terminal coupled to an output node of the amplifier circuit, and a control terminal for receiving a first signal for controlling a current flow in the first circuit;
  a second circuit, having a first terminal coupled to the output node, a second terminal couple to a second power supply terminal; and
  a bias circuit coupled to the control terminal of the first circuit, the bias circuit configured to limit a current flow in the first circuit when a voltage at the output node is outside a predetermined voltage range;

wherein the bias circuit is configured to consume substantially no current when the first signal at the control terminal is within a second predetermined voltage range.

9. The amplifier circuit of claim 8, wherein the first power supply terminal is adapted for coupling to a power supply and the second power supply terminal is adapted for coupling to an electrical ground.

10. The amplifier circuit of claim 8, wherein the second power supply terminal is adapted for coupling to a power supply and the first power supply terminal is adapted for coupling to an electrical ground.

11. The amplifier circuit of claim 8, wherein the bias circuit comprises:
a first terminal coupled to the first power supply terminal;
a second terminal coupled to the control terminal of the first circuit;
a third terminal coupled to the output node of the amplifier circuit;
a plurality of diode devices connected in series between the first terminal and the second terminal of the bias circuit, including a first internal node and a second internal node; and
a switch device coupled between the first internal node and the second internal node; the switch device being configured to reduce a voltage drop between the first internal node and second internal node when the voltage of the output node of the amplifier circuit is out of the predetermined range.

12. The amplifier circuit of claim 11, wherein the plurality diode devices comprises a first diode device between the first terminal and the first internal node, a second and a third diode devices between the first internal node and the second internal node, a fourth and a fifth diode devices connected between the second internal node and the second terminal.

13. The amplifier circuit of claim 11, wherein the plurality of diode devices comprises a first plurality of diode devices serially connected between the first terminal and the first internal node, a second plurality of diode devices serially connected between the first internal node and the second internal node, and a third plurality diode devices serially connected between the second internal node and the second terminal.

14. The amplifier circuit of claim 8, wherein the bias circuit comprises:
a first terminal coupled to the first power supply terminal;
a second terminal coupled to control terminal of the first circuit;
a third terminal coupled to the output node of the amplifier circuit;
a plurality of bias devices connected in series between the first terminal and the second terminal, wherein a first bias device is connected between the first terminal and a first node, a second bias device is connected between the first internal node and a second internal node, and a third bias device is connected between the third internal node and the third terminal; and
a switch coupled between the first internal node and the second internal node, the switch being configured to reduce a voltage drop between the first internal node and second internal node when the voltage of the output node of the amplifier circuit is out of the predetermined range.

15. A bias circuit for providing a bias voltage to an electronic device, the electronic device having a control terminal for controlling a current flow between an input terminal and an output terminal of the electronic device, the bias circuit comprises:
a first terminal coupled to the input terminal of the electronic device;
a second terminal coupled to the output terminal of the electronic device;
a third terminal coupled to the control terminal of the electronic device;
a plurality of bias devices connected in series between the first terminal and the second terminal, wherein a first bias device is connected between the first terminal and a first internal node, a second bias device is connected between the first internal node and a second internal node, and a third bias device is connected between the second internal node and the second terminal; and
a switch coupled between the first internal node and the second internal node, a control terminal of the switch being coupled to the second terminal of the bias circuit, the switch being configured to reduce a voltage drop between the first internal node and second internal node when the voltage of the output terminal of the electronic device is out of a predetermined voltage range.

16. The bias circuit of claim 15 wherein each of the bias devices comprises a rectifier device characterized by a turn-on voltage.

17. The bias circuit of claim 15 wherein each of the bias devices comprises one or more diode devices.

18. An audio system, comprising:
an input for receiving an audio frequency input signal;
an amplifier circuit coupled to the input for receiving the audio frequency input signal, the amplifier circuit including an output driver having a first stage and a second stage connected in series between a power supply and a ground, the output driver having an output node and a control terminal for receiving a signal for controlling a current flow to the output node;
a bias circuit coupled to the control terminal of the output driver, the bias circuit configured to limit a current flow in the output driver when a voltage at the output node is outside a predetermined voltage range,
wherein the bias circuit is configured to consume substantially no current when the first signal at the control terminal is within a second predetermined voltage range; and a speaker coupled to the output driver.

19. The audio system of claim 18, wherein the bias circuit comprises:
a plurality of bias devices connected in series between a first terminal and a second terminal, wherein a first bias device is connected between the first terminal and a first internal node, a second bias device is connected between the first internal node and a second internal node, and a third bias device is connected between the second internal node and the second terminal; and
a switch coupled between the first internal node and the second internal node, a control terminal of the switch being coupled to the second terminal of the bias circuit, the switch being configured to reduce a voltage drop between the first internal node and second internal node when the voltage of the output node of the output driver is out of a predetermined voltage range.

20. The audio system of claim 19 wherein each of the bias devices comprises one or more diode devices.

* * * * *